SEMICONDUCTIVE DEVICE AND APPARATUS

Filed Sept. 19, 1955 2 Sheets-Sheet 1

INVENTORS
WILLIAM E. BRADLEY
JOHN W. TILEY
BY
Allen V. Hazeltine
ATTORNEY

INVENTORS
WILLIAM E. BRADLEY
JOHN W. TILEY
BY
Dean V. Haylene
ATTORNEY 2,929,999

SEMICONDUCTIVE DEVICE AND APPARATUS

William E. Bradley, New Hope, and John W. Tiley, Hatboro, Pa., assignors to Philco Corporation, Philadelphia, Pa., a corporation of Pennsylvania Application September 19, 1955, Serial No. 534,934

3 Claims. (Cl. 330—38)

This invention relates to semiconductive signal-translating devices and to apparatus utilizing such devices. More particularly, it relates to novel semiconductive signal-translating devices having both high input impedance and high gain.

While highly effective for many purposes, semiconductive signal-translating devices which have heretofore been available in the prior art have been limited in their applications by one or more of the often undesirable characteristics of low input impedance or relatively low voltage gain. Either of these characteristics obviously reduces their value for use as voltage amplifiers inasmuch as those devices having a low input impedance will tend to load unduly a voltage source supplying them with an input signal, while those devices having a low gain provide insufficient amplification of the input signal.

To minimize the deleterious effects of the low input impedance which is characteristic of semiconductive devices such as bipolar transistors, it has been necessary heretofore to utilize impedance-transforming devices in the input circuits of these transistors as, for example, step-down transformers coupling the signal source with the input of the transistor. Such transformers are relatively expensive components, in comparison to the resistance-capacitance networks which are commonly used, for example, to couple the signal source to the input grid of a vacuum-tube amplifier stage, and may have undesirable frequency-dependent characteristics tending to limit the bandwidth of the amplifier in which the transformer is included.

However, certain other semiconductive devices are known which possess the high input impedance desired for voltage amplification. One such device is the so-called "analog," or monopolar, transistor, which may typically comprise a body of semiconductive material, to two portions of which are affixed substantially ohmic contacts, and a rectifying electrode system positioned adjacent the current path between the two ohmic contacts. In such analog arrangements, the input impedance seen by a source of input signal voltage coupled to the rectifying electrode system may be relatively high. However, the analog transistor generally has a relatively low gain; moreover, the device is relatively difficult to construct, because it requires two ohmic connections to be made to the semiconductive body. Such connections have been found difficult to fabricate and, as a result, the production costs of the analog transistor have been high when considered in terms of the costs of competing amplifying devices.

It is accordingly an object of the invention to provide a novel semiconductive signal-translating device.

Another object is to provide a semiconductive signal-translating device having both a high input impedance and a high gain.

A still further object is to provide a semiconductive signal-translating device having a high input impedance, but requiring at most only a single ohmic contact.

An additional object is to provide a novel semiconductive signal-translating device which has an excellent high frequency response, and which may have substantial power handling capabilities.

A still further object is to provide a semiconductive signal-translating device which is relatively inexpensive and easy to manufacture.

Yet another object of the invention is to provide a novel semiconductive signal-translating device which is readily adapted for use in summing and modulating arrangements as well as in amplifying arrangements.

In accordance with the invention, these objects are achieved by the provision of a semiconductive signal-translating device which comprises a body of semiconductive material, means for injecting minority-carriers into the body and means for collecting these carriers, a base contact applied to the body, and means, interposed between the base contact and the carrier-injecting means, for varying the electrical resistance between these last two means in response to variations in the value of an applied voltage.

In one preferred emtbodiment of the invention, the minority-carrier injecting and collecting means may respectively have the form of surface-barrier emitter and collector electrodes arranged opposite each other in depressions located on opposing surfaces of the semiconductive body. The means for varying the electrical resistance may comprise a rectifying electrode system arranged to circumscribe the emitter and collector electrodes, while the base contact may be a tab ohmically affixed to the semiconductive body at a position lying outside of the region circumscribed by the rectifying electrode system.

In a second preferred embodiment of the invention particularly suitable for use in transistors having relatively high power-handling capabilities, the base electrode is positioned so that it, instead of the emitter and collector electrodes, is circumscribed by the rectifying electrode system. The emitter and collector electrodes in turn lie in a region of the semiconductive body which is outside of the region circumscribed by the rectifying electrode system. In one arrangement, these electrodes may comprise rings of an appropriate metal, deposited on opposing surfaces of the semiconductive body in a position circumscribing the analog electrode system.

In each of the preferred embodiments of the invention, special provision is made to prevent injected minority-carriers from reaching the resistance-controlling means, thereby to avoid regenerative feedback within the semiconductive structure as well as lowered input impedance. This result is accomplished by utilizing one or more of the following techniques: (1) spacing the minority-carrier injecting means from the resistance-controlling means by substantially more than a minority-carrier diffusion path length; (2) shaping the carrier-collecting means in a manner such that it tends to trap minority-carriers drifting toward the resistance-controlling means; or (3) interposing rectifying guard electrodes between the carrier-injecting means and the resistance-varying means.

In the operation of the foregoing devices, the minority-carrier injecting means is biased, with respect to the base contact, in the polarity of easy conduction, thereby to inject minority-carriers into the semiconductive body. The minority-carrier collecting means is biased in that polarity, with respect to the emitting means, which tends to attract the injected minority-carrier. The resistance-varying means is biased, with respect to the base contact, in the polarity of difficult conduction, whereby this means tends to deplete of current carriers the region of the semiconductive body adjacent to it, and hence to raise the electrical resistance of the current path between the base contact and the minority-carrier injecting means. A voltage-varying signal applied to the resistance-varying means therefore produces corresponding variations in the resistance of the current path between the base contact and the injecting means, and hence, in the amount of base current flowing into the region of the carrier-injecting means. These variations in base current, in turn, vary the potential of the semiconductive body in the vicinity of the injecting means and hence vary the number of minority-carriers injected thereby. A a result, the number of minority-carriers collected by the collecting means is also varied in acordance with the voltage-varying signal. These last-named variations may be utilized to produce voltage variations by including a suitable load device in circuit with the injecting and collecting means.

It will be appreciated that the structure, as operated above, exhibits a very high input impedance by reason of the fact that the voltage-varying input signal is applied to a reverse-biased rectifying electrode. In addition, the voltage gain of the device is relatively great, inasmuch as the input signal in effect undergoes amplification of two types, first, that produced by the portion of the structure comprising the base contact, the resistance-varying means and the minority-carrier injecting means, and second, that produced by the minority-carrier injecting means, the minority-carrier collecting means and the adjacent base region. Moreover, these desirable results are accomplished in a single semiconductive structure which, because it needs at most only one ohmic contact, is relatively simple to construct and lends itself to mass-production techniques.

Other advantages and features of the invention will become apparent from a consideration of the following detailed description, taken in connection with the accompanying drawings, in which.

Figures 1, 2, 3:
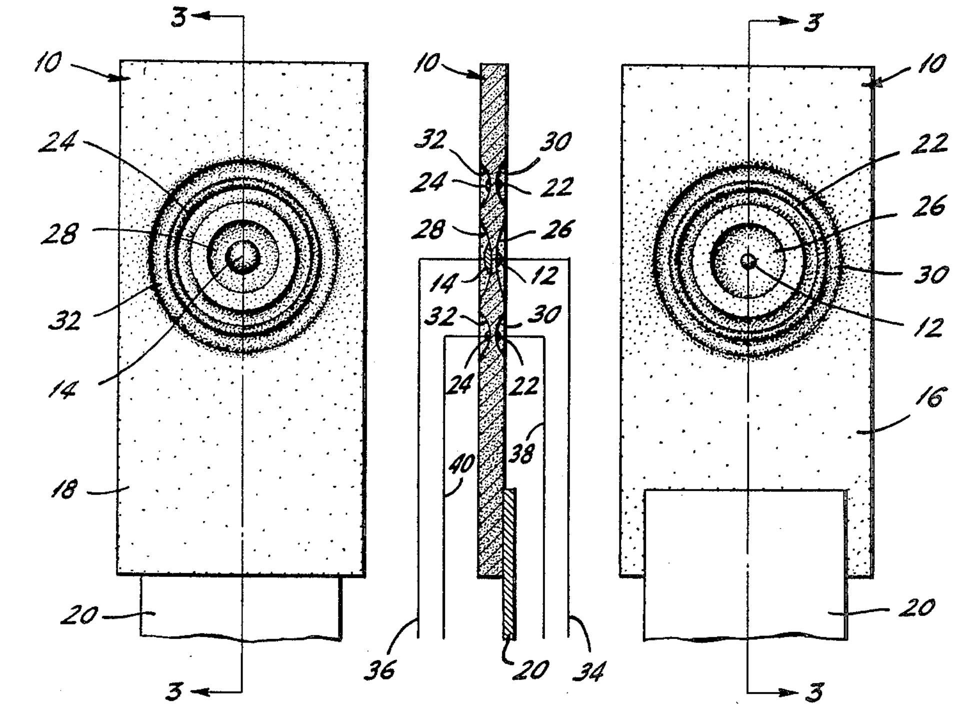
Figures 1 and 2 are plan views showing the two opposite electrode-bearing surfaces of a device constructed in accordance with the invention.
Figure 3 is a cross-sectional view of the structure shown in Figures 1 and 2.

Referring now to Figures 1, 2 and 3, there is shown diagrammatically one of the preferred forms of our novel semiconductive structure, which we shall hereinafter refer to as the compound transistor. The embodiment of the compound transistor shown in Figures 1 to 3 comprises generally a body of semiconductive material in the form of a thin rectangular wafer 10 of N-type germanium; minority-carrier injecting and collecting means which in this embodiment comprise, respectively, surface-barrier emitter and collector contacts 12 and 14, arranged coaxially on opposing surfaces 16 and 18 respectively of body 10; body contacting means which, in the embodiment, comprise a base tab 20 affixed to surface 16, at one end of body 10, in a substantially ohmic manner; and voltage-responsive resistance-varying means interposed between the contacting and injecting means, which resistance-varying means comprise, in this embodiment, a pair of annular surface-barrier electrodes 22 and 24, respectively, which are arranged opposite one another on surfaces 16 and 18, respectively, and which are coaxial with and circumscribe emitter and collector electrodes 12 and 14, respectively.

In order to promote efficient collection by collector 14 of minority-carriers injected by emitter 12, close spacing of these electrodes is provided by depositing them within substantially coaxial depressions 26 and 28, respectively, which are provided on opposing surfaces 16 and 18 respectively of body 10. To the same end of efficient minority-carrier collection, collector 14 preferably has a diameter substantially longer than that of emitter 12, for example, approximately twice as long.

Moreover, to avoid undesirable regeneratively feedback and lowered input impedance, which may be brought about by the transfer to resistance-varying electrodes 22 and 24 of minority-carriers injected by emitter 12, it is a feature of the invention in its preferred form that electrodes 22 and 24 are spaced from emitter 12 by a radial distance substantially greater than the minority-carrier diffusion length which is characteristic of the semiconductive material of which body 10 is composed. Additionally, to provide a substantial amount of control over the resistance of the current path between base tab 20 and emitter 12, resistance-varying electrodes 22 and 24 preferably are separated from one another by a distance less than twice the thickness of the current-carrier depletion zone which is produced when a reverse-biasing potential applied to either electrode 22 or 24 has a value equal to that critical reverse-biasing voltage $E_{max}$ at which avalanche breakdown begins within the semiconductive body 10. To achieve this reltaively close spacing between electrodes 22 and 24, annular, coaxial, and equidiameter depressions 30 and 32 are provided on body surfaces 16 and 18 respectively, within which depressions are deposited rectifying electrodes 22 and 24 respectively.

Connections to the various electrodes are made by attaching lead wires thereto in a substantially ohmic manner. Thus, in the embodiment shown, lead wires 34, 36, 38 and 40 are affixed ohmically to electrodes 12, 14, 22 and 24, respectively, of the compound transistor.

In a typical arrangement, semiconductive body 10 is constituted of N-type monocrystalline germanium having a bulk resistivity of between 2 and 5 ohm-centimeters and a bulk hole lifetime of about 200 microseconds. As aforementioned, body 10 may have the form of a substantially rectangular wafer, which wafer typically may be about 0.100 inch long, 0.050 inch wide, and 0.003 inch thick. The depressions 26 and 28 each may have a surface diameter of about 0.012 inch and a depth of about 0.0014 inch, i.e. a depth such that about 0.0002 inch of germanium separates depressions 26 and 28 at their point of closest approach. Depressions 30 and 32 may each have a mean diameter of 0.025 inch and a width of about 0.010 inch; their depth may be about 0.0013 inch each, i.e. a depth such that 0.0004 inch of germanium separates depressions 30 and 32 at their point of closest approach.

The emitter electrode 12 may have a diameter of 0.004 to 0.006 inch, while collector electrode 14, which preferably has a diameter substantially greater than that of emitter 12, may have a diameter of 0.006 to 0.008 inch. Lastly, rectifying electrodes 22 and 24 may each have a mean diameter of 0.025 inch and a width of 0.005 inch.

Surface barrier electrodes 12, 14, 22 and 24 may each be formed by depositing a suitable metal, such as indium or zinc, within the appropriate depression, by a process referred to hereinafter. Base tab 20, and lead wires 34, 36, 38 and 40 may each be composed of nickel, and may be respectively attached to surface 16, and to their respective electrodes, by means of a tin solder.

Figure 4:
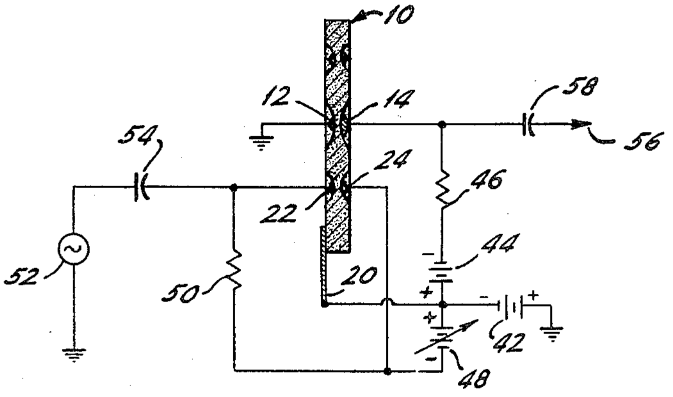
Figure 4 is a schematic diagram of signal-translating apparatus utilizing the semiconductive structure shown in Figures 1 to 3.

Figure 4 illustrates a simple amplifying stage constructed in accordance with our invention, wherein the gain-providing element comprises the compound transistor shown in Figures 1 to 3, and corresponding parts are indicated by corresponding numerals. In this circuit, it is assumed that the semiconductive body 10 of the compound transistor is of N-type germanium. Accordingly, in order to produce minority-carrier injection by emitter electrode 12, that electrode is established at a potential positive with respect to base tab 20, while, in order to effect minority-carrier collection, collector 14 is established at a potential negative with respect to emitter 12 and preferably negative with respect to base tab 20. In the specific arrangement illustrated in Figure 4, these potentials are established by connecting base tab 20 of the compound transistor to the negative pole of a source of direct voltage 42 whose positive pole is connected to a point at ground potential, while connecting emitter 12 directly to the point at ground potential. In addition, collector 14 is supplied with a potential which is negative with respect to the potentials both of emitter 12 and of base tab 20 by means of a source of direct voltage 44 having its positive pole connected to base tab 20, and having its negative pole connected to collector 14 by an output load device represented by resistor 46.

In accordance with the invention in one aspect, the rectifying electrodes 22 and 24 are reverse-biased with respect to the base of the compound transistor by means of a potential negative with respect to that of base tab 20. This negative potential is supplied by a source of direct voltage 48 which has its positive pole directly connected to the base tab 20 and its negative pole directly connected to rectifying electrode 24. Electrode 22 is also connected to the negative pole of source 48, via an input impedance represented by a resistor 50. To permit a critical adjustment of the potential difference between base tab 20 and electrodes 22 and 24 respectively, source 48 is preferably one whose output voltage can be adjusted.

Because each of the rectifying electrodes 22 and 24 is reverse-biased with respect to base tab 20, each acts, in a manner well known to the art, to produce a current-carrier depletion zone, within the constricted region of body 10 lying between them, whose extent is directly dependent upon the value of the reverse-biasing potential-difference between base tab 20 and electrodes 22 and 24. Accordingly, as the value of this reverse-biasing potential difference is increased from zero, the electrical resistance between base tab 20 and the region of body 10 adjacent emitter electrode 12 and collector electrode 14 increases, in substantially direct dependence thereupon. At a critical value of this potential difference, which value is inversely dependent upon the bulk resistivity of the semiconductive material of which body 10 is fabricated, and is directly dependent upon the thickness of body 10, substantially all of the current carriers present between electrodes 22 and 24 are extracted. As a result, the resistivity of body 10 becomes extremely high in this region, and the resistance of body 10 between base tab 20 and the region of body 10 between electroeds 22 and 24 becomes correspondingly high.

To obtain the largest amount of variation in resistance between base tab 20 and the aforementioned region of body 10, in response to a variation in the value of an applied signal, it is necessary that the spacing be small between the depletion zones produced by potentials applied to electrodes 22 and 24 respectively. However, if the thickness of body 10 between these electrodes is too large, the desired small spacing between the depletion zones cannot be produced for voltages less than that for which harmful avalanche breakdown occurs within the semiconductive body. Accordingly, it is highly desirable that this body thickness be as small as possible, consistent with the requirements of mechanical strength, and, in any event, be less than twice the depletion zone thickness at which avalanche breakdown begins.

In the specific arrangement shown in Figure 4, rectifying electrode 24 is maintained at a fixed back-biasing potential as determined by the output voltage of source 48, while the value of the back-biasing potential applied to rectifying electrode 22 is varied in accordance with variations in a time-varying input signal voltage supplied by a source 52 which is coupled to electrode 22 by a blocking capacitor 54. The value of the reverse-biasing potential supplied by source 48 is adjusted to be one intermediate zero and the aforementioned critical potential which cuts off current through the annular constriction in body 10. In addition, the maximum variation in amplitude of the input signal supplied by source 52 may be chosen in a manner such that electrode 22 is never driven to a zero or positive potential with respect to base tab 20, nor to a potential so negative that current flow through the aforesaid annular constriction of body 10 is cut off.

Under these conditions, the electrical resistance across this annular constriction is varied in a manner directly dependent upon the variations in amplitude of the input signal supplied by source 52. When the signal at electrode 22 becomes more positive, the electrical resistance across the construction falls. As a result, an increased base current flows between base tab 20 and emitter 12, and the potential of body 10 adjacent emitter 12 becomes more negative in response to the negative potential supplied to tab 20. Since emitter 12 is maintained at ground potential, this negative swing in the potential of body 10 adjacent emitter 12 causes emitter 12 to inject into body 10 an increased number of minority-carriers. This increased number of minority-carriers injected by emitter 12 in turn results in a directly proportional increase in the number of minority-carriers collected by collector 14, i.e. a directly proportional increase in the minority-carrier current flowing through load resistor 46. In short, it is seen that a positive-going variation in signal voltage applied to electrode 22 produces a positive-going increase in the potential at collector 14. This collector-voltage variation may then be supplied to an output terminal 56, which is coupled to collector 14 by a blocking capacitor 58.

With regard to the just-described mode of operation of our semiconductive structure as utilized in the amplifying arrangement of Figure 4, it will first be noted that the input impedance seen by source 52 looking into electrode 22 is very high, e.g. of the order of 50,000 to 100,000 ohms, because rectifying electrodes 22 and 24 are operated in their reverse-biased conditions. Moreover, it will be appreciated that the amplifier has a high voltage gain, which may be of the order of 40 to 60 decibels. This high gain is achieved for two reasons: first, only a relatively few current-carriers are present in the constricted annular region of body 10, between electrodes 22 and 24. As a result, a relatively small change in voltage at electrode 22 produces a relatively large change in the number of current carriers in the annular constriction, and a correspondingly large change in the emitter-to-base current, all of which must flow through the constriction. This large change in emitter-to-base current produces, in turn, a large change in the potential of body 10 adjacent emitter 12. Consequently, a large change takes place in the number of minority-carriers emitted by emitter 12. Substantially all of the minority-carriers emitted by emitter 12 are collected by collector 14, by reason of the extreme closeness of these two electrodes and the fact that the diameter of collector 14 is larger than that of emitter 12. Accordingly, this large change in minority-carrier emission is substantially completely reflected in a corresponding change in the collector current flowing through output load 46. Since the impedance of this load may be relatively high, the voltage variation produced thereacross, in response to the voltage variation applied to electrode 22, is a highly amplified replica of the latter variation.

In our novel arrangement of Figure 4, the circuit components may typically have the following values:

| | | |
|---|---|---|
| Source 42 | volts D.-C. | 3 |
| Source 44 | do | 3 |
| Resistor 46 | ohms | 10,000 |
| Source 48 | volts D.-C. | 5 to 15 |
| Resistor 50 | ohms | 50,000 |
| Capacitor 54 | microfarads | 0.5 |
| Capacitor 58 | do | 0.1 |

It is to be understood that these values are exemplary only and that we do not intend that the scope of our invention shall be limited thereto.

Moreover, it is, of course, to be understood that the arrangement of Figure 4 represents only one of the many circuit arrangements in which out compound transistors may usefully be employed. For example, the arrangement of Figure 4 may readily be converted into an adding circuit merely by inserting an input impedance (not shown) in series with the connection between rectifying electrode 24 and the negative pole of source 48, and by coupling to electrode 24 the source (not shown) of the signal to be added to that of source 52. The value of the signal produced at output terminal 56 is then substantially proportional to the sum of the values of the input signals supplied to electrodes 22 and 24.

In addition, the compound transistor is readily adapted for use as a modulating element by supplying one of the input waves (either the carrier wave or the intelligence wave) to rectifying electrode 22 while supplying the other wave to emitter electrode 12. There will then be produced, at output terminal 56, a wave whose amplitude is proportional to that of the carrier-wave, amplitude-modulated in accordance with the intelligence wave.

With the foregoing discussion in mind, it will be clear to those skilled in the art that our compound transistor may be utilized in numerous other circuit arrangements. For example, by appropriate adjustment of the bias applied by source 48 to electrodes 22 and 24, and of the maximum amplitude excursion of a sinusoidal signal signal supplied by source 52, a pulsatile waveform may be generated at output terminal 56. In this regard, it is noted that, in a compound transistor having the exemplary dimensions given hereinbefore, the transistor has a substantial output at collector 14 in response to input signals at electrode 22 having frequencies up to (and beyond) 30 mc./sec.

Moreover, in those instances in which phase-inverter operation is desired, it is only necessary to insert an appropriate load impedance in series with the connection between the emitter 12 and the point at ground potential, to produce, at emitter 12, an output signal in phase opposition to that produced at collector 14.

The fabrication of the embodiment of our compound transistor which is shown in Figures 1 to 3 may be accomplished with relative ease by utilizing the jet electrolytic process described in copending patent application Serial No. 472,824 of J. W. Tiley and R. A. Williams, filed December 3, 1954, entitled "Semiconductive Devices and Methods for the Fabrication Thereof," and assigned to the assignee of the present application. As an example, depressions 26 and 28 may be excavated from body 10 by directing against body 10 a fine jet of electrolyte of appropriate diameter whose electrical potential is negative with respect to body 10. Preferably this electrolyte contains ions of the metal eventually to be deposited in the excavated depression as a surface barrier electrode. After the depression has been excavated to the desired depth, an area electrode of the surface-barrier type may be deposited therein by reversing the polarity of the potential at which the electrolyte is maintained. The properties of the surface-barrier electrodes thus formed and suitable for emitter and collector are discussed in detail in copending patent application Serial No. 472,826 of R. A. Williams and J. W. Tiley, filed December 3, 1954, entitled "Electrical Device," and assigned to the assignee of the present application.

Annular depressions 30 and 32 may also be excavated, and annular rectifying electrodes 22 and 24 deposited by the jet electrolytic process described in the aforementioned application Serial No. 472,824. As pointed out in that application, excavation may be accomplished by rotating the body about an axis passing through the midpoints of depressions 26 and 28, while simultaneously impinging body 10 with an etching jet whose center of impingement is displaced from the aforesaid axis by the mean radius of the annular excavation. Deposition of electrodes 22 and 24 may again be accomplished by utilizing an electrolyte containing ions of the metal to be plated, and applying to the electrolyte a potential poled positive with respect to the body.

In each of the foregoing operations, the depth to which the excavation has proceeded at any time may be determined and controlled by any of a variety of techniques, including the punch-through technique described in the aforementioned application Serial No. 472,824, the bias-controlled etching technique described in copending patent application Serial No. 418,887 of W. E. Bradley, filed March 26, 1954, and entitled "Electrical Method and Device," the infra-red spectral measurement technique described in copending patent application Serial No. 449,347 of R. N. Noyce, filed August 12, 1954, and entitled "Electrical Method and Apparatus," and the colorimetric technique described in patent application Serial No 424,704 of T. V. Sikina, filed April 21, 1954, and entitled "Method and Apparatus for Producing Semiconductive Structures." Each of these applications is also assigned to the assignee of the present application.

Figures 5, 6, 7, 8:
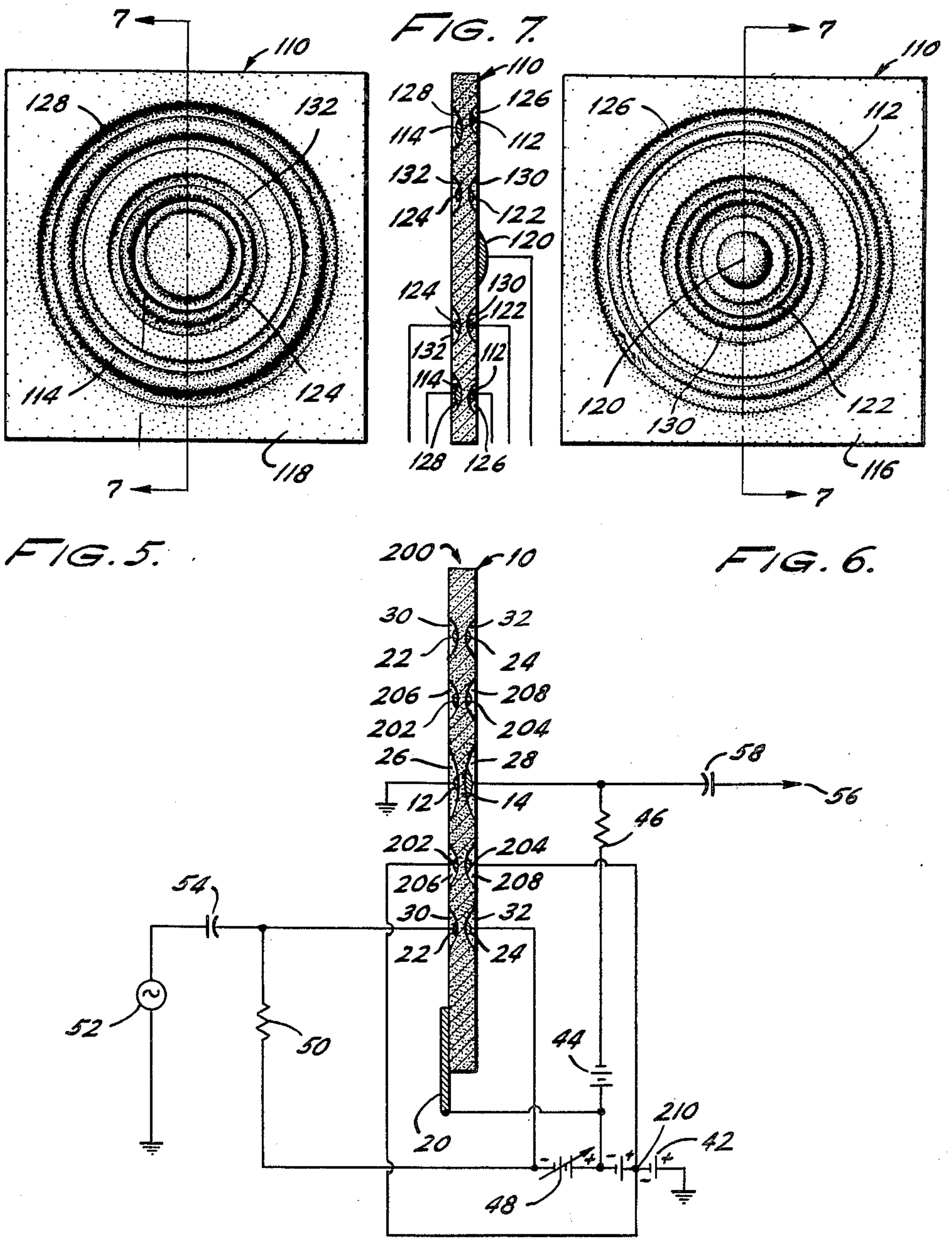
Figures 5 and 6 are plan views showing the two electrode-bearing surfaces of a second embodiment of our novel semiconductive structure.
Figure 7 is a cross-sectional view of the semiconductive structure shown in Figures 5 and 6.
Figure 8 illustrates a third embodiment of our novel semiconductive structure, arranged in signal translating apparatus.

A second preferred embodiment of our novel compound transistor which is particularly useful in power transistor applications is shown at Figures 5, 6 and 7 of the drawings. The latter arrangement, while comprising electrodes having the same functions as the electrodes embodied in the structure illustrated in Figures 1 to 3, differs from this structure in that the electrodes are arranged in an order inverse to that of Figures 1 to 3. Thus, in the arrangement of Figures 5 to 7, a base electrode 120, corresponding to base tab 20 of the preceding embodiment, is positioned centrally upon a semiconductive body 110 of N-type monocrystalline germanium, which may have substantially square major surfaces 116 and 118 respectively. The base electrode 120 preferably makes a substantially ohmic contact with body 110 and may be fabricated in various well-known manners, e.g. by sandblasting, on surface 116, an area whose shape is determined by the aperture of a mask applied to this surface, and by vaporizing onto this sandblasted area a layer of pure tin or other metal which has the property of bonding substantially ohmically to germanium.

An annular excavation 130, coaxial with electrode 120, is formed on surface 116 of body 110 while, on the opposite surface 118 excavation 132 is formed coaxial and codiametral with excavation 130. These excavations correspond to excavations 30 and 32, respectively of the preceding embodiment. Within depressions 130 and 132 are located rectifying electrodes 122 and 124, respectively. These electrodes, which may be surface-barrier electrodes deposited by the aforementioned jet electrolytic process, correspond to electrodes 22 and 24, respectively, of the preceding embodiment. As in the preceding embodiment, the thickness of germanium separating electrodes 122 and 124 is preferably established at a value less than twice the depth of the current-carrier depletion region which is produced when a reverse-biasing potential, applied to either electrode 122 or 124, has a value equal to the critical reverse-biasing voltage $E_{max}$ at which avalanche breakdown begins within body 110.

The compound transistor of this second preferred embodiment additionally comprises an annular emitter electrode 112 and an annular collector electrode 114, which electrodes are arranged, within annular excavations 126 and 128 respectively, substantially coaxially with the other electrodes of the transistor. Excavation 126 is formed on surface 116 while excavation 128 is formed on surface 118. Emitter electrode 112 and collector electrode 114 may each be a surface-barrier electrode formed by using the aforementioned jet electrolytic process.

The mean diameters of annular excavations 126 and 128 are such that the separations of emitter and collector electrodes 112 and 114 from rectifying electrodes 122 and 124, respectively, are considerably greater than the diffusion length of minority-carriers within body 110. The reason for this is to avoid a substantial flow of minority-carriers from the emitter to an input electrode, e.g. either electrode 122 or electrode 124 of the transistor. As discussed hereinbefore, such a flow of minority-carriers produces a lowered input impedance, as well as undesirable regenerative feedback tending to produce unstable operation of the transistor.

It will be noted, however, that the mean diameter of depression 128, containing collector electrode 114, is slightly smaller than the mean diameter of depression 126, containing emitter electrode 112. Moreover, the width of emitter electrode 112 is substantially smaller than the width of collector electrode 114. As a result, the inner boundary of annular collector electrode 114 is substantially closer to the axis of the electrodes than is the inner boundary of annular emitter contact 112. This collector construction serves to trap more efficiently those minority-carriers emitted by emitter 112 which are diffusing toward rectifying contacts 122 and 124. Thus, this emitter-collector geometry militates against regenerative feedback of minority-carriers to electrodes 122, 124, and also increases the percentage of minority-carriers transferred from the emitter 112 to the collector 114 of the compound transistor.

The mode of operation of this embodiment of our compound transistor is substantially the same as that of the first embodiment shown in Figures 1 to 3. Accordingly, the semiconductive structure of Figures 5 to 7 may be biased and operated in the manner described in connection with Figure 4, due regard being had to the interchanged positions of the emitter-collector contacts and the base contact. However, the compound transistor of Figures 5 to 7 is capable of providing amplification at substantially higher power levels than the transistor of Figures 1 to 3, by reason of the substantially larger areas of the annular emitter and collector electrodes 112 and 114, respectively. Consequently, the embodiment of Figures 5 to 7 finds particular application in power amplifiers such as audio power amplifiers.

Still another arrangement according to our invention is shown in Figure 8. This arrangement embodies a compound transistor having generally the structure of the transistor shown in Figures 1 to 3, but comprising an additional pair of rectifying electrodes 202 and 204. These electrodes are positioned on body 10 intermediate the emitter and collector electrode assembly 12, 14 and the rectifying electrode assembly 22, 24 at a distance from the emitter and collector which is preferably substantially greater than the aforementioned minority-carrier diffusion length. In the arrangement shown, electrodes 202 and 204 may be deposited within annular depressions 206 and 208, respectively, which may be positioned on the opposing surfaces of body 10 substantially coaxially with depressions 26, 28, 30 and 32. These depressions 206 and 208 may be excavated by utilizing the aforementioned jet electrolytic process, and rectifying electrodes 202 and 204, which may be surface-barrier electrodes, may be deposited by the same process.

Rectifying electrodes 202 and 204 are utilized to collect any stray minority-carriers injected into body 10 by emitter 12 which may have diffused into the vicinity of electrodes 202 and 204. The purpose of collecting these minority-carriers in this manner is to reduce even further the possibility that minority-carriers from the emitter may reach the input electrodes, particularly input electrode 22, and thereby produce the aforementioned undesirable feedback effect as well as lowered input impedance. To this end, compound transistor 200 may be connected in the arrangement of Figure 8, which is similar to that of Figure 4, but in which electrodes 202 and 204 are supplied with a small reverse-biasing potential. This potential is sufficient to cause electrodes 202 and 204 to collect those minority-carriers which diffuse into their vicinity, but is insufficient to increase substantially the resistance of body 10 within the annular constriction thereof lying between electrodes 202 and 204. This reverse-biasing potential may be derived, for example, from a tap 210 on source 42, which tap supplies a voltage whose value is less than that supplied to collector 14, to the end that electrodes 202 and 204 shall not compete with collector 14 for minority-carriers. Inasmuch as the circuit arrangement of Figure 8 has substantially the same mode of operation as that of the arrangement of Figure 4, it is believed unnecessary to discuss this arrangement in greater detail.

The two principal embodiments of our novel compound transistor described in detail hereinbefore represent only certain preferred structures chosen from among the numerous arrangements falling within the scope of our invention. Thus, while, in each of the aforedescribed embodiments of our compound transistor, two rectifying input electrodes are provided, (i.e. electrodes 22 and 24 in the embodiments of Figures 1 to 4, and 8, and electrodes 122 and 124 in the embodiment of Figures 5 to 7), only a single rectifying electrode to which the input signal is supplied is in fact essential. However, when the second rectifying electrode is omitted, it is usually desirable to cleanse carefully the surface area to which this electrode is normally affixed and to coat this area with an inert material, such as an epoxy resin plastic. This coating then protects the surface from contaminants which might produce high-conductivity channels therealong. Moreover, the maximum thickness of the body underlying the single rectifying electrode is ordinarily only half of the maximum thickness which is permissible when two rectifying electrodes are used, thereby to provide effective control over the base-to-emitter resistance.

In addition, the various rectifying contacts indicated in the several embodiments need not be surface-barrier area contacts but, depending on their functions, may take any one of a variety of forms. More particularly, such contacts may alternatively be P–N junction contacts.

Moreover, compound transistors according to our invention may have electrode arrangements whose geometry differs substantially from those described hereinbefore. Thus, in the arrangements wherein the relative position of the electrodes are those shown in Figures 1 to 3, it is not necessary that rectifying electrodes 22 and 24 be annular in geometry, so long as these electrodes are positioned so as to be able to exert substantial control over the base-to-emitter current. These electrodes, for example, may alternatively have the geometry of linear bars located opposite one another on opposing surfaces of body 10 and extending across body 10 at an orientation such as to divide body 10 into two portions, one containing base tab 20 and the other containing emitter and collector electrodes 12 and 14 respectively.

In addition, emitter and collector electrodes 12 and 14 need not be located on opposing surfaces of body 10, but may be positioned on the same surface thereof. In one such arrangement, for example, there may be arranged on one surface of the semiconductive body a centrally-positioned emitter electrode, a collector electrode of annular form and concentric with the emitter electrode, a rectifying input electrode, also annular in form, which has a diameter greater than that of the collector electrode and is concentric therewith, and a base contact affixed to the body outside of the region surrounded by the input electrode. In still another alternative arrangement, the emitter and collector electrode may both be point contacts lying in a region circumscribed by the input electrode and separated thereby from the base electrode.

Moreover, while semiconductive body 10 has been specifically designated hereinbefore as being constituted of N-type germanium, it is to be understood that this body may alternatively be constituted of other semiconductive materials, e.g. P-type germanium, P-type silicon, or any of various intermetallic compounds such as indium antimonide. In each of these cases, the natures of the rectifying elements may be modified in manners well known to those skilled in the art, to provide the requisite properties as described hereinbefore.

Although we have described our invention with particular reference to specific embodiments thereof in order to provide a degree of definiteness such as to enable one skilled in the art to practice it, it is to be understood that the invention is in no way limited to such arrangements and methods, but is susceptible of embodiment in any of a wide variety of forms without departing from the scope thereof.

We claim:

1. A signal-translating device comprising: a body of semiconductive material having two substantially plane-parallel surfaces; a substantially circular minority-carrier injecting electrode applied to one of said surfaces; a substantially circular rectifying electrode for collecting said minority carriers, said collecting electrode being positioned on the other of said surfaces substantially coaxially with said injecting electrode; a first annular rectifying electrode positioned on said one surface substantially concentrically with said injecting electrode and a second annular rectifying electrode positioned on said other surface substantially concentrically with said collecting electrode and opposite to said first annular rectifying electrode, each of said first and second annular rectifying electrodes having an inner diameter which exceeds the outer diameter of said injecting electrode by an amount greater than twice the diffusion path-length of said minority-carriers in said body; third and fourth annular rectifying electrodes applied respectively to said one and said other surfaces of said body, said third and fourth annular electrodes having respective inner diameters exceeding the respective outer diameters of said first and second annular electrodes and being positioned concentrically therewith; and an ohmically contacting element applied to a portion of said body lying outside of the regions thereof circumscribed by said third and fourth annular rectifying electrodes.

2. A signal-translating device according to claim 1, wherein said body of semiconductive material is constituted of n-type germanium; wherein said collecting electrode has an outer diameter greater than said outer diameter of said injecting electrode; wherein said first and second annular rectifying electrodes have substantially the same outer and inner diameters, said last-named inner diameter exceeding by said amount said outer diameter of said collector electrode; wherein said third and fourth annular rectifying electrodes have substantially the same outer and inner diameters; and wherein each of said injecting, said collecting, and said first, second, third and fourth annular rectifying electrodes is a surface-barrier electrode.

3. A signal-translating device according to claim 1, said device comprising means for applying a forward-biasing potential to said injecting electrode; means for applying a first reverse-biasing potential to said collecting electrode; means for applying to said third and fourth annular rectifying electrodes a second reverse-biasing potential; means for applying to said first and second annular rectifying electrodes a third reverse-biasing potential having a value less than the value of each of said first and second potentials; means for supplying to one of said third and fourth annular rectifying electrodes a signal having intelligence variations; and means for deriving an output signal from said collecting electrode in response to said intelligence signal.

References Cited in the file of this patent

UNITED STATES PATENTS

| | | |
|---|---|---|
| 2,600,500 | Haynes et al. | June 17, 1952 |
| 2,672,528 | Shockley | Mar. 16, 1954 |
| 2,701,281 | White | Feb. 1, 1955 |
| 2,754,431 | Johnson | July 10, 1956 |
| 2,801,348 | Pankove | July 30, 1957 |
| 2,816,228 | Johnson | Dec. 10, 1957 |

OTHER REFERENCES

Bradley article, Proc. of IRE, December 1953, pages 1702–1705.

Shea text, "Principles of Transistor Circuits," pp. 470–478, pub. 1953 by John Wiley & Sons, Inc., N.Y.C.